US012795876B2

(12) United States Patent
Shoda et al.

(10) Patent No.: US 12,795,876 B2
(45) Date of Patent: Nov. 10, 2026

(54) DESIGNED ELECTROMAGNETIC WAVE SUPPRESSOR, AND BUILDING MATERIAL, ELECTROMAGNETIC WAVE SUPPRESSION CHAMBER, AND SYSTEM PROVIDED WITH THE SUPPRESSOR

(71) Applicant: TOPPAN INC., Tokyo (JP)

(72) Inventors: Ryo Shoda, Tokyo (JP); Hiroyoshi Nishiyama, Tokyo (JP); Miho Imai, Tokyo (JP); Junya Tanabe, Tokyo (JP); Takeshi Ikeda, Tokyo (JP)

(73) Assignee: TOPPAN INC., Tokyo (JP)

( * ) Notice: Subject to any disclaimer, the term of this patent is extended or adjusted under 35 U.S.C. 154(b) by 505 days.

(21) Appl. No.: 18/199,338

(22) Filed: May 18, 2023

(65) Prior Publication Data

US 2024/0040758 A1 Feb. 1, 2024

Related U.S. Application Data

(63) Continuation of application No. PCT/JP2021/042204, filed on Nov. 17, 2021.

(30) Foreign Application Priority Data

Nov. 20, 2020 (JP) ................................ 2020-193306

(51) Int. Cl.
*H05K 9/00* (2006.01)
*B32B 27/08* (2006.01)
(Continued)

(52) U.S. Cl.
CPC ........... *H05K 9/0081* (2013.01); *B32B 27/08* (2013.01); *B32B 27/32* (2013.01); *B32B 27/36* (2013.01);
(Continued)

(58) Field of Classification Search
CPC .. H05K 9/0081; H05K 9/0003; H05K 9/0088; B32B 27/08; B32B 27/32;
(Continued)

(56) References Cited

FOREIGN PATENT DOCUMENTS

CN 111902036 B * 9/2023 ........... H05K 9/0083
JP H10-217397 A 8/1998
(Continued)

OTHER PUBLICATIONS

International Searching Authority, "International Search Report," issued in connection with International Patent Application No. PCT/JP2021/042204, dated Feb. 15, 2022.
(Continued)

*Primary Examiner* — Zhitong Chen
(74) *Attorney, Agent, or Firm* — Foley & Lardner LLP

(57) ABSTRACT

A designed electromagnetic wave suppressor includes a design layer, and an electromagnetic wave suppressor having an electromagnetic wave return attenuation of 10 dB or more. A building material includes the designed electromagnetic wave suppressor. An electromagnetic wave suppression chamber includes a room in which at least part of the inner walls is covered with the building material, and a transmitter disposed in the room. A system includes the electromagnetic wave suppression chamber, and a wireless communication device disposed in the electromagnetic wave suppression chamber.

13 Claims, 6 Drawing Sheets

(51) Int. Cl.

| | |
|---|---|
| ***B32B 27/32*** | (2006.01) |
| ***B32B 27/36*** | (2006.01) |
| ***E04B 1/92*** | (2006.01) |

(52) U.S. Cl.

CPC ............. *E04B 1/92* (2013.01); *H05K 9/0003* (2013.01); *B32B 2255/10* (2013.01); *B32B 2255/205* (2013.01); *B32B 2255/26* (2013.01); *B32B 2264/102* (2013.01); *B32B 2307/212* (2013.01); *B32B 2419/00* (2013.01)

(58) Field of Classification Search

CPC ................ B32B 27/36; B32B 2255/10; B32B 2255/205; B32B 2255/26; B32B 2264/102; B32B 2307/212; B32B 2419/00; B32B 2255/28; B32B 2262/106; B32B 5/16; B32B 5/30; B32B 15/16; B32B 5/02; B32B 9/048; B32B 2307/206; B32B 9/007; B32B 27/28; B32B 2255/06; B32B 2607/00; B32B 15/20; B32B 27/14; B32B 7/025; E04B 1/92

See application file for complete search history.

(56) References Cited

FOREIGN PATENT DOCUMENTS

| | | | | | |
|---|---|---|---|---|---|
| JP | 2006-200226 | A | | 8/2006 | |
| JP | 4111565 | B2 | * | 7/2008 | ............. B23B 27/00 |
| JP | 2010-153542 | A | | 7/2010 | |
| JP | 2010157696 | A | * | 7/2010 | ............... H05K 9/00 |
| JP | 5138623 | B2 | * | 2/2013 | ............... H05K 9/00 |
| JP | 2017-112253 | A | | 6/2017 | |
| JP | 2017-216337 | A | | 12/2017 | |
| JP | 2019102665 | A | * | 6/2019 | ............... H05K 9/00 |
| JP | 2019-178076 | A | | 10/2019 | |
| JP | 2020-161584 | A | | 10/2020 | |
| KR | 102123392 | B1 | * | 6/2020 | ......... H05K 7/20481 |
| WO | WO-2018/124131 | A1 | | 7/2018 | |

OTHER PUBLICATIONS

International Searching Authority, "Written Opinion," issued in connection with International Patent Application No. PCT/JP2021/042204, dated Feb. 15, 2022.

Office Action issued in corresponding Korean Patent Application No. 10-2023-7020357 dated Jun. 11, 2026.

* cited by examiner

Fig, 2(a)
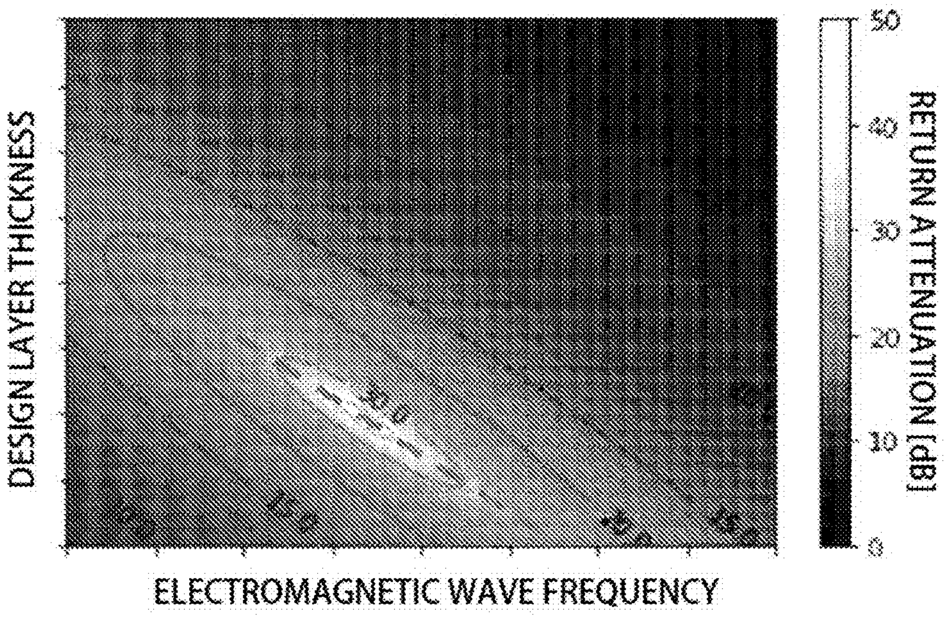
Fig, 2(b)
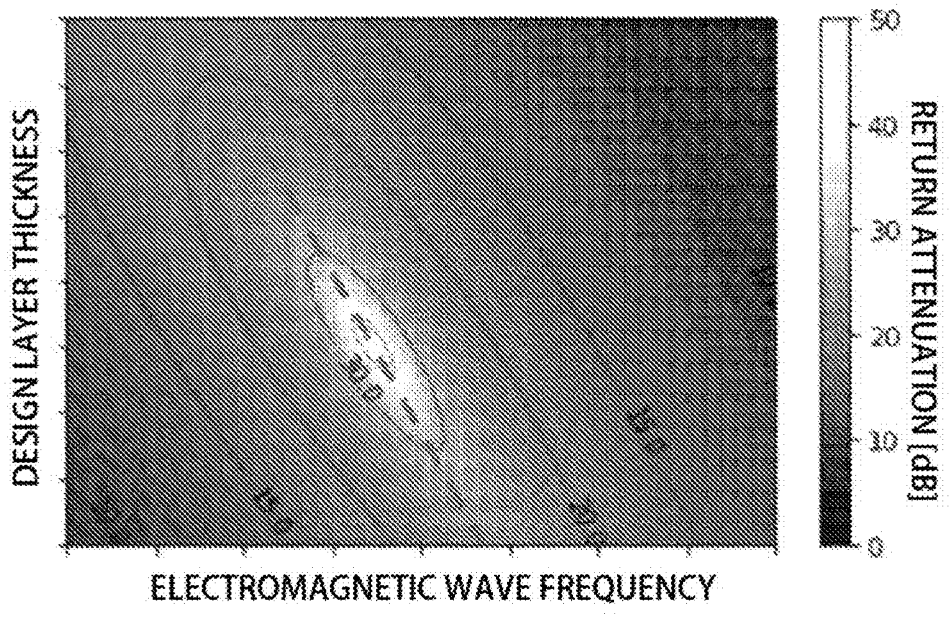

Fig, 3(a)
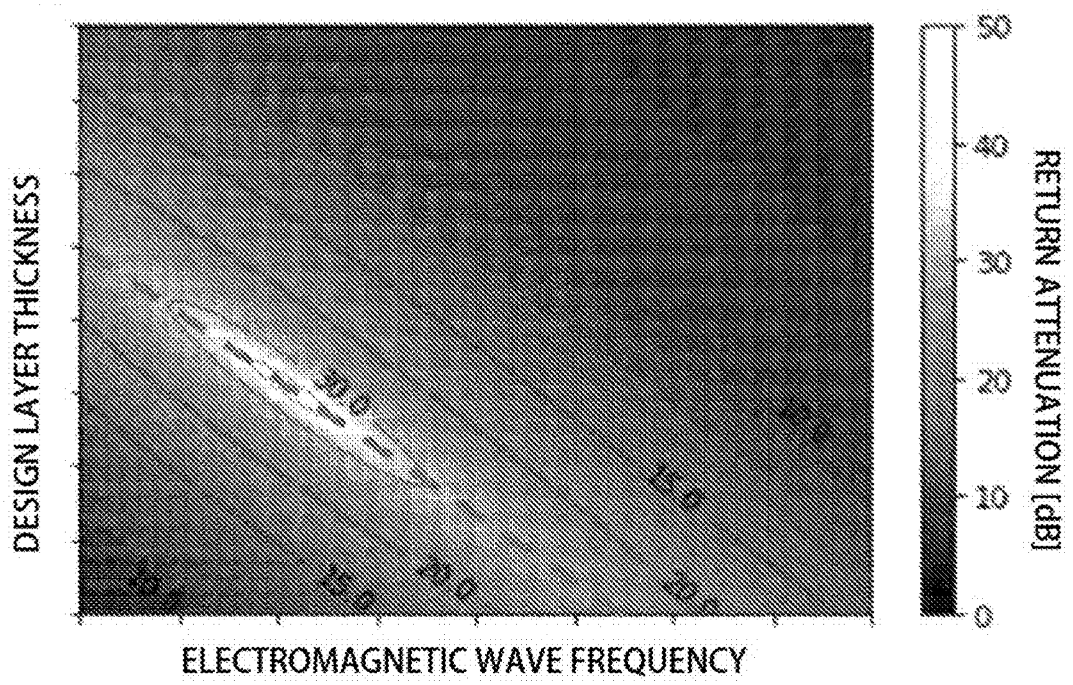
Fig, 3(b)
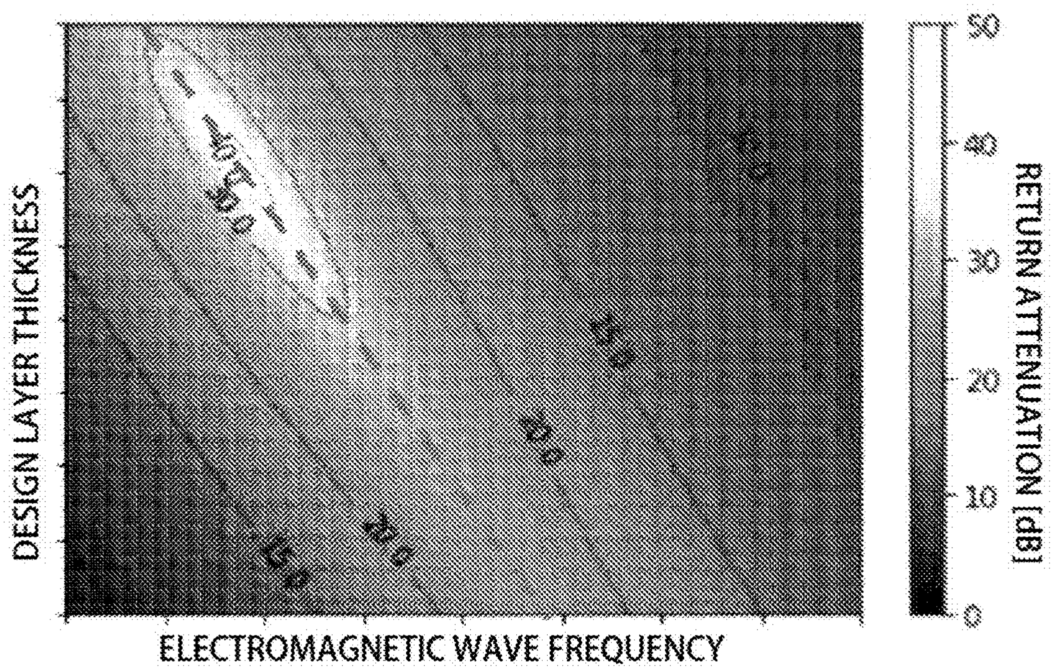

Fig, 6(a)
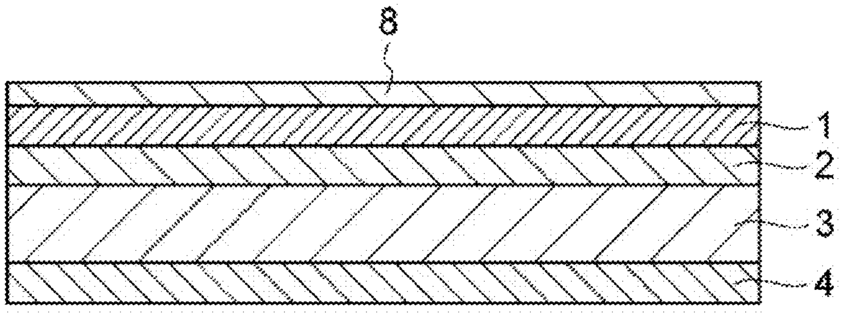
Fig, 6(b)
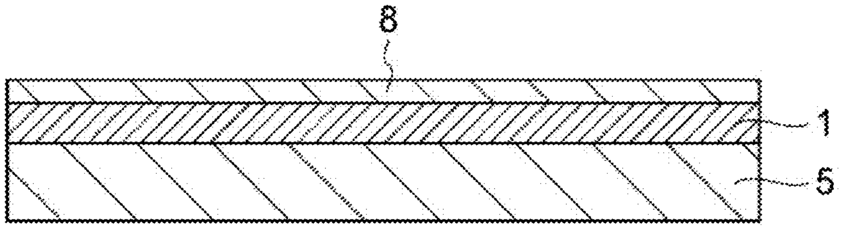
Fig, 6(c)
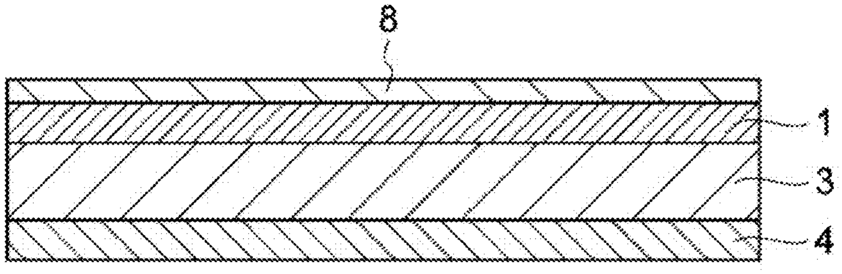

DESIGNED ELECTROMAGNETIC WAVE SUPPRESSOR, AND BUILDING MATERIAL, ELECTROMAGNETIC WAVE SUPPRESSION CHAMBER, AND SYSTEM PROVIDED WITH THE SUPPRESSOR

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2021/042204, filed on Nov. 17, 2021, which in turn claims the benefit of JP 2020-193306, filed Nov. 20, 2020, the disclosures of all which are incorporated herein by reference in its entirety.

TECHNICAL FIELD

The present disclosure relates to designed electromagnetic wave suppressors, and building materials, electromagnetic wave suppression chambers, and systems provided with the suppressors.

BACKGROUND

In recent years, the need for communication, radar, and security scanners, and the like is increasing in order to cope with the rapid increase in information volume, speeding up of mobile vehicles, autonomous driving, and the practical use of IoT (Internet of Things). Along with this, technologies related to 5G, or high-speed wireless communication systems using next-generation electromagnetic waves, such as millimeter waves, and terahertz waves, are progressing rapidly.

Products that use electromagnetic waves may interfere with electromagnetic waves generated by other electronic devices and cause malfunctions. As a technique for preventing this, for example, an electromagnetic wave suppression sheet and a coating agent used therefor have been proposed (see PTLs 1 to 3). Types of electromagnetic wave suppression sheets are roughly classified into transmissive type and reflective type. The transmissive type uses magnetic materials having the ability to absorb electromagnetic waves to reduce electromagnetic waves by allowing them to pass through the layer containing the magnetic materials. The reflective type reduces electromagnetic waves by causing interference between incident electromagnetic waves and reflected electromagnetic waves.

[Citation List] [Patent Literature] PTL 1: JP 2010-153542 A; PTL 2: JP 2017-112253 A; PTL 3: JP 2017-216337 A.

SUMMARY OF THE INVENTION

Technical Problem

The electromagnetic wave suppression sheets of the conventional art have given no consideration to aesthetic properties and, therefore, it has been difficult to use these sheets for interior wallpaper, for example. The present disclosure provides a designed electromagnetic wave suppressor having aesthetic properties, while having a function of suppressing electromagnetic waves. The present disclosure provides a building material, an electromagnetic wave suppression chamber, and a system to which the designed electromagnetic wave suppressor is applied.

Solution to Problem

A designed electromagnetic wave suppressor according to the present disclosure includes a design layer, and an electromagnetic wave suppressor having an electromagnetic wave return attenuation of 10 dB or more. With the electromagnetic wave suppressor having a return attenuation of 10 dB or more, scattering or noise of the electromagnetic waves in the space where the designed electromagnetic wave suppressor is disposed can be sufficiently reduced.

The electromagnetic wave suppressor may be a laminate including either of a dielectric layer and a magnetic layer, and a reflective layer, or may be a laminate including a resistance layer, either of a dielectric layer and a magnetic layer, and a reflective layer in this order. The real part of the complex permittivity of the design layer is preferred to be 5 or less. The imaginary part of the complex permittivity of the design layer is preferred to be 0.5 or less. With the complex permittivity of the design layer satisfying the above conditions, the influence of the design layer on the return attenuation of the electromagnetic wave suppressor can be reduced even when the design layer has a thickness of, for example 50 μm or more. In addition, even when the resistance layer has variation in sheet resistance, the influence of the designed electromagnetic wave suppressor on the return attenuation can be reduced, thereby providing an advantage of stably producing the designed electromagnetic wave suppressor achieving a large return attenuation. As the real part of the complex permittivity of the design layer becomes larger and as the thickness of the design layer increases, the reflection attenuation frequency changes to the lower frequency side. The real part of the complex permittivity of the design layer can be controlled according to the material forming the design layer, and thus can be controlled by the materials (e.g., inorganic filler) contained in the design layer.

The resistance layer is preferred to have a sheet resistance in the range of 270 Ω/sq to 500 Ω/sq. With the sheet resistance of the resistance layer being in this range, a larger return attenuation (e.g., 20 dB or more) can be achieved. With the sheet resistance of the resistance layer being controlled, the return attenuation of the designed electromagnetic wave suppressor can be controlled.

The designed electromagnetic wave suppressor may further include a surface protective layer on the outermost surface, the surface protective layer containing at least one of an antiviral agent and an antibacterial agent. The surface protective layer is a layer for imparting stain resistance, abrasion resistance, or water resistance to the surface of the design layer. With the surface protective layer containing at least one of an antiviral agent and an antibacterial agent, the electromagnetic wave suppression performance can be maintained for a long period of time even when dirt such as oil becomes adhered to the outermost surface.

A building material according to the present disclosure includes the above designed electromagnetic wave suppressor. An electromagnetic wave suppression chamber according to the present disclosure includes a room in which at least part of the inner walls is covered with the above building material, and a transmitter disposed in the room. A system according to the present disclosure includes the electromagnetic wave suppression chamber, and a wireless communication device disposed in the electromagnetic wave suppression chamber. As an example of the system, a virtual reality theater (VR theater) can be mentioned.

Advantageous Effects of the Invention

According to the present disclosure, a designed electromagnetic wave suppressor having aesthetic properties and having a function of suppressing electromagnetic waves can be provided. According to the present disclosure, a building material, an electromagnetic wave suppression chamber, and a system to which the designed electromagnetic wave suppressor is applied can be provided. By applying the designed electromagnetic wave suppressor of the present disclosure to, for example, industrial materials such as road surface materials, guardrails, road signs, and soundproof walls used in a road environment, scattering or noise of electromagnetic waves can be suppressed and thus, for example, the suppressor can contribute to improving safety of autonomous driving.

BRIEF DESCRIPTION OF THE DRAWINGS

FIGS. 2(*a*) and 2(*b*) are graphs showing the results of simulations.

FIGS. 3(*a*) and 3(*b*) are graphs showing the results of simulations.

FIGS. 6(*a*) to 6(*c*) are schematic cross-sectional views illustrating designed electromagnetic wave suppressors including surface protective layers.

DETAILED DESCRIPTION

Figure 1:
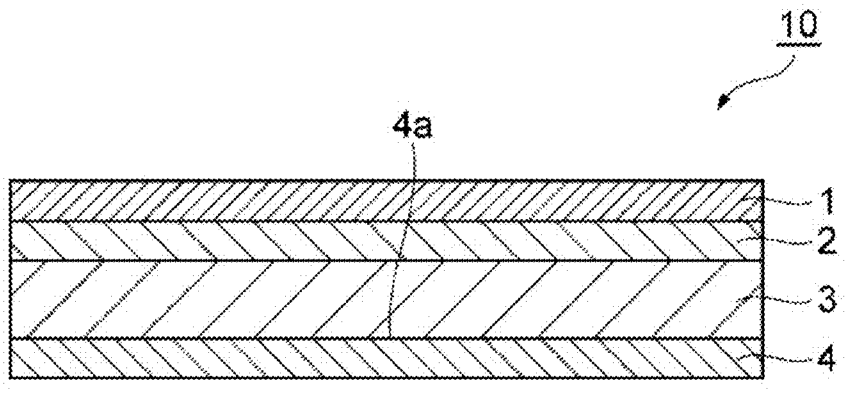
FIG. 1 is a schematic cross-sectional view illustrating a designed electromagnetic wave suppressor according to a first embodiment of the present disclosure.

With reference to the drawings, some embodiments of the present disclosure will be described in detail. It should be noted that, in the drawings, like or corresponding parts are designated with like reference signs to avoid duplicate description. The positional relationship between left, right, top and bottom is based on the positional relationship shown in the drawings unless otherwise specified. The dimensional ratios in the drawings are not limited to those shown therein.

First Embodiment

FIG. 1 is a schematic cross-sectional view illustrating a designed electromagnetic wave suppressor according to the present embodiment. A designed electromagnetic wave suppressor 10 shown in the figure has a film- or sheet-like shape and has a laminated structure including a design layer 1, a resistance layer 2, an electromagnetic wave suppression layer 3, and a reflective layer 4 in this order. The thickness of the designed electromagnetic wave suppressor is preferred to be, for example, 12 μm to 50,000 μm, more preferred to be 25 μm to 5,000 μm, and even more preferred to be 50 μm to 1,500 μm. In the present embodiment, the electromagnetic wave suppressor is formed of the resistance layer 2, the electromagnetic wave suppression layer 3, and the reflective layer 4. This electromagnetic wave suppressor forms a λ/4 type electromagnetic wave absorber so that a large return attenuation can be achieved. The return attenuation of the electromagnetic wave suppressor is preferred to be 10 dB or more, more preferred to be 15 dB or more, and even more preferred to be 20 dB or more. For strict measurement environment application conforming to anechoic chamber standards, the return attenuation of the electromagnetic wave suppressor is most preferred to be 40 dB or more. The upper limit of the return attenuation of the electromagnetic wave suppressor may be, for example, 67 dB. The individual layers will be described below.

(Design Layer)

The design layer 1 is a layer that imparts aesthetic properties to the electromagnetic wave suppressor. The design layer 1 is provided with a printed pattern, such as a wood grain pattern suitable for living spaces, a pattern of signs suitable for road traffic networks, or white and gray patterns such as tiled patterns. The design layer 1 is required not to hinder the performance of the electromagnetic wave suppressor, as much as possible. The thickness of the design layer 1 is preferred to be, for example, 1 μm to 1,000 μm, more preferred to be 25 μm to 500 μm, and even more preferred to be 100 μm to 200 μm.

The real part of the complex permittivity of the design layer 1 is preferred to be 5 or less, more preferred to be 2.0 to 5.0, and even more preferred to be 2.0 to 3.0, from the perspective of suppressing variation in reflection attenuation frequency with respect to the variation in thickness of the design layer 1. The imaginary part of the complex permittivity of the design layer 1 is preferred to be 0.5 or less, more preferred to be 0 to 0.3, and even more preferred to be 0 to 0.1, from the perspective of achieving a return attenuation suitable for practical use. If the real part and/or imaginary part of the complex permittivity of the design layer 1 are in the above ranges, the influence of the design layer 1 on the return attenuation of the electromagnetic wave suppressor can be reduced even when the design layer 1 has a thickness of, for example 50 μm or more. In addition, even when the resistance layer 2 has variation in sheet resistance, the influence of the designed electromagnetic wave suppressor 10 on the return attenuation can be reduced, thereby providing an advantage of stably producing the designed electromagnetic wave suppressor 10 achieving a large return attenuation.

The complex permittivity can be expressed by the following formula. In the formula, i represents an imaginary unit, ε' represents the real part of the complex permittivity, and ε" represents the imaginary part of the complex permittivity.

$$\text{Complex permittivity } \varepsilon=\varepsilon'-i\varepsilon''$$

The real part of the complex permittivity is a relative permittivity (ratio of vacuum to permittivity $\varepsilon_0$). The imaginary part ε" of the complex permittivity is derived from a dielectric tangent tan δ(=ε"/ε'). The relative permittivity and the dielectric tangent can be obtained using a permittivity measurement device.

FIGS. 2(*a*), 2(*b*), 3(*a*) and 3(*b*) are the results of simulations each showing a relationship between electromagnetic wave frequency (horizontal axis), design layer thickness (vertical axis), and return attenuation (return loss). Using in-house simulation software, the real part and imaginary part of the complex permittivity of the design layer were determined as follows.

FIG. 2(*a*) . . . Real part: 5, imaginary part: 0

FIG. 2(*b*) . . . Real part: 2.87, imaginary part: 0

FIG. 3(*a*) . . . Real part: 5, imaginary part: 0.5

FIG. 3(*b*) . . . Real part: 2.87, imaginary part: 0.5

Comparisons between FIGS. 2(*a*) and 2(*b*) and between FIGS. 3(*a*) and 3(*b*) show that the thickness margin of the design layer that can achieve a large return attenuation (e.g., 20 dB or more) tends to increase as the real part of the complex permittivity of the design layer decreases. In other words, the inclinations of the dashed lines (absolute values) indicated in the graphs tend to become larger. However, comparisons between FIGS. 2(*a*) and 3(*a*) and between FIGS. 2(*b*) and 3(*b*) show that the return attenuation tends to increase in relatively thin design layers as the imaginary part of the complex permittivity of the design layer decreases. In other words, the areas where the return attenuation is large (bright areas) tend to be shifted to the lower parts of the graphs. It should be noted that the vertical axis range is the same between FIGS. 2(*a*) and 3(*a*), and the vertical axis range is the same between FIGS. 2(*b*) and 3(*b*).

The design layer 1 may have a multilayer structure. The design layer 1 having a multilayer structure may include, for example, a top coat, clear resin layer, printed layer, colored layer, and primer layer. The top coat is a layer for protecting the design layer 1 from dirt or for improving scratch resistance. The clear resin layer is a layer for enhancing adhesion between the top coat and the printed layer or improving scratch resistance. The printed layer is a layer for imparting aesthetic properties to the design layer 1. The colored layer is a layer for emphasizing the color of the printed layer. The primer layer is a layer for enhancing adhesion to the electromagnetic wave suppressor.

(Resistance Layer)

The resistance layer 2 is a layer for guiding the electromagnetic waves incident from outside to the electromagnetic wave suppression layer 3. In other words, the resistance layer 2 is a layer for performing impedance matching according to the environment where the designed electromagnetic wave suppressor 10 is used or the characteristics of the design layer 1. For example, if the designed electromagnetic wave suppressor 10 is used in air (impedance: 377 Ω/sq), and if the real part of the complex permittivity (relative permittivity) of the electromagnetic wave suppression layer 3 is 2.9, and the thickness of the layer 3 is 500 μm, a large return attenuation can be achieved by determining the sheet resistance of the resistance layer 2 to be in the range of 270 to 500 Ω/sq (more preferably 350 to 430 Ω/sq).

The resistance layer 2 is formed of a material having electrical conductivity. Such a material may be an inorganic or organic material. Examples of the inorganic material having electrical conductivity include nanoparticles and/or nanowires containing one or more materials selected from the group consisting of indium tin oxide (ITO), indium zinc oxide (IZO), zinc aluminum oxide (AZO), carbon nanotubes, graphene, Ag, Al, Au, Pt, Pd, Cu, Co, Cr, In, Ag—Cu, Cu—Au, and Ni. Examples of the organic material having electrical conductivity include polythiophene derivatives, polyacetylene derivatives, polyaniline derivatives, and polypyrrole derivatives. From the perspective of flexibility, film formability, stability, and seat resistance, the resistance layer 2 is preferred to be formed of a conductive polymer containing polyethylenedioxythiophene (PEDOT). For example, the resistance layer 2 may be formed of a mixture (PEDOT/PSS) of polyethylenedioxythiophene (PEDOT) and polystyrene sulfonate (PSS).

The sheet resistance of the resistance layer 2 can be adequately determined, for example, by selecting the material having electrical conductivity, and controlling the thickness of the resistance layer 2. The thickness of the resistance layer 2 is preferred to be in the range of 0.1 μm to 2.0 μm, and more preferred to be in the range of 0.1 μm to 0.4 μm. If the thickness is 0.1 μm or more, a uniform film can be easily formed, and there is a tendency that the function as a resistance layer 2 can be more sufficiently achieved. If the thickness is 2.0 μm or less, there is a tendency that sufficient flexibility can be maintained, and the resultant thin film is more reliably prevented from being cracked due to external factors, such as bending or stretching, after being formed.

The sheet resistance can be measured using, for example, a Loresta-GP MCP-T610 (trade name, manufactured by Mitsubishi Chemical Analytech Co., Ltd.).

(Electromagnetic Wave Suppression Layer)

The electromagnetic wave suppression layer 3 is a dielectric layer for causing interference between incident electromagnetic waves and reflected electromagnetic waves. The thickness or other factors are determined so as to satisfy the conditions expressed by the following formula when the imaginary part of the complex permittivity of the electromagnetic wave suppression layer 3 is 0.

$$d = \lambda / \left(4(\varepsilon_r)^{1/2}\right)$$

In the formula, λ represents the wavelength (unit: m) of the electromagnetic waves to be suppressed, $\varepsilon_r$ represents the real part of the complex permittivity (relative permittivity) of the material forming the electromagnetic wave suppression layer 3, and d represents the thickness (unit: m) of the electromagnetic wave suppression layer 3. A return attenuation can be obtained when the phase of the incident electromagnetic waves is shifted by π from the phase of the reflected electromagnetic waves.

The electromagnetic wave suppression layer 3 may be formulated by adding a dielectric material and/or magnetic material to increase the real part of the complex permittivity of the electromagnetic wave suppression layer 3. Thus, the thickness of the electromagnetic suppression layer 3 can be reduced, and at least part of the electromagnetic waves can be absorbed in the electromagnetic suppression layer 3. The dielectric material may be an inorganic or organic material. Examples of the inorganic material include barium titanate, titanium oxide, zinc oxide, and nanoparticles thereof. Examples of the organic material include polycarbonate, epoxy resins, glyptal, polyvinyl chloride, polyvinyl formal, methacrylic resins, phenolic resins, urea resins, and polychloroprene resins. According to the specification, the above inorganic materials may be dispersed in any desired organic materials. If nanoparticles of the above inorganic materials are dispersed in the above organic materials, high dispersibility is achieved and thus a film with a uniform surface can be obtained. Examples of the magnetic material include metals or compounds containing at least one element selected from iron, nickel and cobalt.

The thickness of the electromagnetic wave suppression layer 3 is preferred to be, for example, 50 μm to 80 μm for the terahertz 300 GHz band, or 200 μm to 400 μm for the millimeter-wave band of 60 to 79 GHz, or 500 μm to 7,000 μm for 3 GHz to 30 GHz.

The electromagnetic wave suppression layer 3 may be formed of an adhesive or cohesive resin material. Thus, the electromagnetic wave suppression layer 3 can be efficiently bonded to a surface 4*a* of the reflective layer 4. Examples of such a material include silicone adhesives, acrylic adhesives, and urethane adhesives. According to the specification, any high-dielectric inorganic materials may be dispersed in these materials. If a silicone adhesive whose real part of the complex permittivity (relative permittivity) is 3.0 is used, for example, as a material for forming the electromagnetic wave suppression layer 3, the thickness of the electromagnetic wave suppression layer 3 may be determined as follows according to the wavelength of the electromagnetic waves to be suppressed. For example, if the electromagnetic waves of a suppression target are millimeter waves and have a wavelength of 1 mm to 10 mm, the thickness of the electromagnetic wave suppression layer 3 may be around 0.144 mm to 1.4 mm. If the electromagnetic waves of a suppression target are submillimeter waves (terahertz waves) and have a wavelength of 100 μm to 1,000 μm (frequency of 3.0 to 0.3 THz), the thickness of the electromagnetic wave suppression layer 3 may be around 14.4 μm to 144 μm.

(Reflective Layer)

The reflective layer 4 is a layer for reflecting the electromagnetic waves incident from the electromagnetic wave suppression layer 3 and guiding them to the electromagnetic wave suppression layer 3. The thickness of the reflective layer 4 is preferred to be, for example, 0.05 μm to 100 μm, and more preferred to be 12 μm or more (e.g., 12 μm to 80 μm).

The reflective layer 4 is formed of, for example, a material having electrical conductivity with a sheet resistance of 100 Ω/sq or less. Such a material may be an inorganic or organic material. Examples of the inorganic material having electrical conductivity include nanoparticles and/or nanowires containing one or more materials selected from the group consisting of indium tin oxide (ITO), indium zinc oxide (IZO), zinc aluminum oxide (AZO), carbon nanotubes, graphene, Ag, Al, Au, Pt, Pd, Cu, Co, Cr, In, Ag—Cu, Cu—Au, and Ni. Examples of the organic material having electrical conductivity include polythiophene derivatives, polyacetylene derivatives, polyaniline derivatives, and polypyrrole derivatives. A film of an inorganic or organic material having electrical conductivity may be formed on a substrate. From the perspective flexibility, film formability, stability, sheet resistance, and cost reduction, a laminate film including a PET film and an aluminum layer deposited on the PET film (Al-deposited PET film) is preferred to be used as a reflective layer.

Second Embodiment

Figure 4:
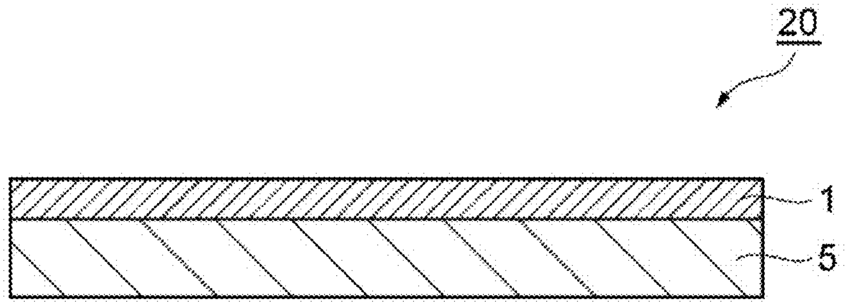
FIG. 4 is a schematic cross-sectional view illustrating a designed electromagnetic wave suppressor according to a second embodiment of the present disclosure.

FIG. 4 is a schematic cross-sectional view illustrating an electromagnetic wave suppressor according to the present embodiment. A designed electromagnetic wave suppressor 20 shown in the figure has a film- or sheet-like shape and has a laminated structure including a design layer 1, and an electromagnetic wave absorption layer 5 (electromagnetic wave suppressor). Electromagnetic waves passed through the design layer 1 reaches the electromagnetic wave absorption layer 5 where at least part of the electromagnetic waves is absorbed. In other words, the designed electromagnetic wave suppressor 20 is classified into the transmissive type. The electromagnetic wave absorption layer 5 will be described.

(Electromagnetic Wave Absorption Layer)

The electromagnetic wave absorption layer 5 is a layer that absorbs at least part of the electromagnetic waves passed through the design layer 1 to reduce electromagnetic waves. The electromagnetic wave absorption layer 5 may only need to contain a dielectric material and/or magnetic material. The thickness of the electromagnetic wave absorption layer 5 may be determined according to the frequency to be absorbed or the return attenuation. The thickness of the electromagnetic wave absorption layer 5 is preferred to be, for example, 5 μm to 50 μm, more preferred to be 500 μm to 1,500 μm, and even more preferred to be 1,500 μm to 20,000 μm.

If the electromagnetic wave absorption layer 5 contains a dielectric material, the electromagnetic wave absorption layer 5 is a dielectric layer. The material forming the electromagnetic wave absorption layer 5 is preferred to achieve a dielectric loss (tan δ) of $1\times10^{-2}$ or more for the frequency to be reduced. The dielectric loss (tan δ) can be expressed by the following formula.

$$\tan\delta = \varepsilon'' / \varepsilon'$$

In the formula, ε' represents the real part of the complex permittivity, and ε" represents the imaginary part of the complex permittivity.

The dielectric material contained in the electromagnetic wave absorption layer 5 may be an inorganic or organic material. Examples of the inorganic material include barium titanate, titanium oxide, zinc oxide, and nanoparticles thereof. Examples of the organic material include polycarbonate, epoxy resins, glyptal, polyvinyl chloride, polyvinyl formal, methacrylic resins, phenolic resins, urea resins, and polychloroprene resins. According to the specification, the above inorganic materials may be dispersed in any desired organic materials. If nanoparticles of the above inorganic materials are dispersed in the above organic materials, high dispersibility is achieved and thus a film with a uniform surface can be obtained.

If the electromagnetic wave absorption layer 5 contains a magnetic material, the electromagnetic wave absorption layer 5 is a magnetic layer. The material forming the electromagnetic wave absorption layer 5 is preferred to achieve a magnetic loss (tan δ) of $1\times10^{-2}$ or more for the frequency to be reduced. The magnetic loss (tan δ) can be expressed by the following formula.

$$\tan\delta = \mu'' / \mu'$$

In the formula, μ' represents the real part of the complex magnetic permeability, and μ" represents the imaginary part of the complex magnetic permeability.

Examples of the magnetic material contained in the magnetic wave absorption layer include metals or compounds containing at least one element selected from iron, nickel and cobalt.

The designed magnetic wave suppressor 10, 20 according to the above embodiments can be applied to articles required to have aesthetic properties. Specific examples of the articles include building materials (e.g., mirror surface decorative plates, floor sheets, and decorative films), and industrial materials (e.g., road surface materials, guardrails, road signs, soundproof walls). An adhesive layer may be provided to the surface of the designed magnetic wave suppressor 10, 20 facing away from the surface provided with the design layer 1, so that the designed magnetic wave suppressor 10, 20 can be easily installed by being bonded at a desired position. A separator film may be attached to the surface of the adhesive layer so that the adhesive layer can be protected until use.

Building materials formed of the designed magnetic wave suppressor 10, 20 can be applied to electromagnetic wave suppression chambers. Such an electromagnetic wave suppression chamber includes, for example, a room in which at least part of the inner walls is covered with the above building materials, and a transmitter disposed in the room. A wireless communication device may be disposed in the electromagnetic wave suppression chamber, and, for example, a system such as a high-definition VR theater using high-speed communication may be constructed.

Figure 5:
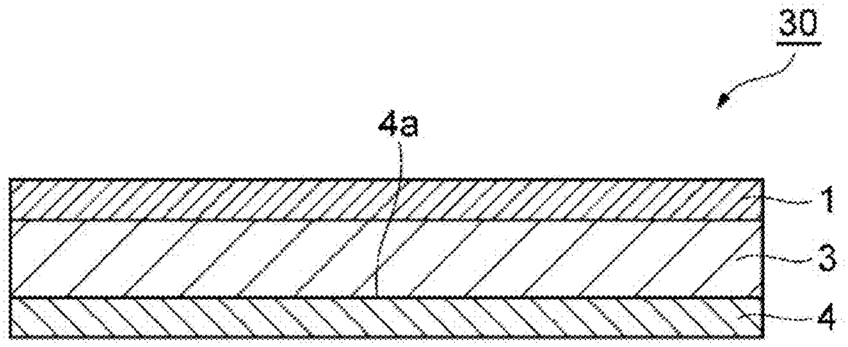
FIG. 5 is a schematic cross-sectional view illustrating a modification of the designed electromagnetic wave suppressor shown in FIG. 1.

The embodiments of the present disclosure have been described so far; however, the present invention should not be construed as being limited to the above embodiments. For example, a mode including the resistance layer 2 for performing impedance matching has been exemplified as the designed electromagnetic wave suppressor 10; however, the resistance layer 2 does not have to be provided if no impedance matching is required to be performed. A designed electromagnetic wave suppressor 30 shown in FIG. 5 has a laminated structure including a design layer 1, an electromagnetic wave suppression layer 3, and a reflective layer 4 in this order.

The above embodiments have exemplified the designed electromagnetic wave suppressor 10, 20, 30 having a sheet- or film-like shape; however, the shape of the electromagnetic wave suppressor should not be limited to this. For example, a non-layered reflector may be used instead of the reflective layer 4. A non-layered absorber may be used instead of the electromagnetic wave absorption layer 5.

The above embodiments have exemplified the designed electromagnetic wave suppressor 10, 20, 30 including the design layer 1 on the outermost surface; however, as shown in FIGS. 6(*a*) to 6(*c*), a surface protective layer 8 covering the design layer 1 may be further provided. The surface protective layer 8 imparts stain resistance, abrasion resistance, or water resistance to the surface of the designed electromagnetic wave suppressor. From the perspective of abrasion resistance and solvent resistance, the resin forming the surface protective layer 8 is preferred to be a urethane resin, and from the perspective of improving surface hardness, it is more preferred to be a urethane resin with isocyanate added to acrylic polyol.

The surface protective layer 8 may be a layer that imparts antiviral or antibacterial properties to the surface of the designed electromagnetic wave suppressor. In other words, the surface protective layer 8 may contain a binder resin (e.g., the above urethane resins), and an antiviral agent and/or antibacterial agent. The total mass of the antiviral and antibacterial agents in the surface protective layer 8 is preferred to be, for example, 0.2 to 20 parts by mass, more preferred to be 0.2 to 10 parts by mass, and even more preferred to be 3 to 7 parts by mass, with respect to 100 parts by mass of the binder resin. If the surface protective layer 8 contains an antiviral agent and/or antibacterial agent, the design layer is prevented from being deteriorated by, for example, the growth of microbes even when dirt such as oil has adhered to the outermost surface of the designed electromagnetic wave suppressor, so that the electromagnetic wave suppression performance can be maintained for a long period of time. The design layer 1 may be imparted with antiviral and/or antibacterial properties by adding an antiviral agent and/or antibacterial agent to the design layer 1. The total mass of the antiviral and antibacterial agents in the design layer 1 is preferred to be, for example, 0.2 to 20 parts by mass, more preferred to be 0.2 to 10 parts by mass, and even more preferred to be 3 to 7 parts by mass, with respect to 100 parts by mass of the design layer 1.

Imparting antiviral properties refers to that 2 $\log_{10}$ or more antiviral activity is indicated in the antiviral test according to ISO 21702. The antiviral agent refers to a substance having the above antiviral properties. Examples of the antiviral agent that can be used include inorganic antibacterial agents such as antibacterial zeolite, antibacterial apatite, and antibacterial zirconia formed by incorporating metal ions such as silver ions, copper ions, and zinc ions into substances such as zeolite, apatite, zirconia, etc., that are inorganic compounds. Examples of the antiviral agent may include organic antibacterial agents such as zinc pyridine, 2-(4-thiazolyl)-benzimidazole, 10,10-oxybisphenoxazine, organic nitrogen sulfur halogen-based substances, and pyridine-2-thiol-oxide. The antibacterial agent includes silver-based antibacterial agents, inorganic antibacterial agents, organic antibacterial agents, etc., and may be selected according to usage.

The thickness of the surface protective layer 8 is preferred to be, for example, 10 μm to 50 μm, more preferred to be 10 μm to 40 μm, and even more preferred to be 10 μm to 25 μm. If the thickness is 10 μm or more, a uniform layer can be easily formed by coating, while securing sufficient surface strength, and there is a tendency that functions as a surface protective layer 8 can be sufficiently achieved. On the other hand, if the thickness is 50 μm or less, there is a tendency that sufficient flexibility can be maintained.

The real part of the complex permittivity of the surface protective layer 8 is preferred to be 7 or less, more preferred to be 2.0 to 5.0, and even more preferred to be 2.0 to 3.0, from the perspective of suppressing variation in reflection attenuation frequency with respect to the variation in thickness of the surface protective layer 8. The imaginary part of the complex permittivity of the surface protective layer 8 is preferred to be 0.5 or less, more preferred to be 0 to 0.3, and even more preferred to be 0 to 0.1, from the perspective of achieving the return attenuation suitable for practical use. If the real part and/or imaginary part of the complex permittivity of the surface protective layer 8 are in the above ranges, the influence of the surface protective layer 8 on the return attenuation of the electromagnetic wave suppressor can be reduced even when the surface protective layer 8 has a thickness of, for example 50 μm.

EXAMPLES

Examples and comparative examples of the present disclosure will be described. The present invention should not be construed as being limited to the following examples.

Electromagnetic wave suppressors related to examples and comparative examples were prepared using the following materials. The real part of the complex permittivity (relative permittivity) and dielectric tangent of the design layer (interior decorative sheet) or the electromagnetic wave suppression layer were measured using Model No. u (manufactured by KEYCOM Corporation). The value of the imaginary part of the complex permittivity was calculated from these measured values.

(1) Design Layer

Interior decorative sheet: 101 ECO SHEET (manufactured by Toppan Inc., thickness: 140 μm, real part of complex permittivity: 2.85, imaginary part of complex permittivity: 0)

(2) Resistance Layer

Mixture (PEDOT/PSS) of polyethylenedioxythiophene (PEDOT) and polystyrene sulfonate (PSS) (manufactured by Nagase ChemteX Corporation).

(3) Electromagnetic Wave Suppression Layer

Magnetic material: Epsilon nano-iron oxide particles (manufactured by Iwatani Corporation)

Binder resin: Butadiene resin (manufactured by Asahi Kasei Corporation)

Acrylic adhesive: OC-3405 (trade name, manufactured by Saiden Chemical Industry Co., Ltd.)

Nanoparticles of barium titanate (manufactured by Sakai Chemical Industry Co., Ltd., average particle size: 100 nm)

(4) Reflective Layer

Al deposited PET film

Example 1

A transmissive type electromagnetic wave suppressor whose layers were formed of the materials shown in Table 1 was prepared as follows. Specifically, an electromagnetic wave suppression layer (thickness: $2.5\times10^3$ μm) was formed using a coating liquid containing 30 parts by mass of binder resin with respect to 100 parts by mass of magnetic material. The real part of the complex permittivity of the electromagnetic wave suppression layer was 0.8 and the imaginary part of the complex permittivity thereof was 0.3. An interior decorative sheet as a design layer was bonded to the surface of the electromagnetic wave suppression layer.

Example 2

A reflective type electromagnetic wave suppressor whose layers were formed of the materials shown in Table 1 was prepared as follows. Specifically, an electromagnetic wave suppression layer (thickness: 1,990 μm) was formed using a coating liquid containing 70 parts by mass of acrylic adhesive with respect to 100 parts by mass of barium titanate ($BaTiO_4$). The real part of the complex permittivity of the electromagnetic wave suppression layer was 10.8 and the imaginary part of the complex permittivity thereof was 0.74. An interior decorative sheet as a design layer was bonded to the surface of the electromagnetic wave suppression layer. A reflective layer was provided to the surface of the electromagnetic wave suppression layer facing away from the surface provided with the design layer.

Example 3

A reflective type electromagnetic wave suppressor whose layers were formed of the materials shown in Table 1 was prepared as follows. Specifically, an electromagnetic wave suppression layer (thickness: 260 μm) was formed using a coating liquid containing 70 parts by mass of acrylic adhesive with respect to 100 parts by mass of barium titanate ($BaTiO_4$). The real part of the complex permittivity of the electromagnetic wave suppression layer was 10.8 and the imaginary part of the complex permittivity thereof was 0.74. A resistance layer containing PEDOT/PSS (sheet resistance: 430 Ω/sq) was provided to the surface of the electromagnetic wave suppression layer. An interior decorative sheet as a design layer was bonded to the surface of the resistance layer. A reflective layer was provided to the surface of the electromagnetic wave suppression layer facing away from the surface provided with the resistance layer. The sheet resistance of the resistance layer was measured using a high-resistance low-efficiency meter (manufactured by Mitsubishi Chemical Analytic Tech Corporation).

Comparative Example 1

For comparison with the examples, an Al deposited PET film (reflective layer) that was the same as those used in Examples 1 and 2 was prepared.

Comparative Example 2

A sample for comparison was prepared as in Example 1 except that no design layer was provided.

Comparative Example 3

For comparison, a millimeter radio wave absorber with multiple square pyramids arranged side by side (manufactured by Iwatani Corporation) was prepared.

Evaluations

The effect of suppressing electromagnetic waves was evaluated for the examples and the comparative examples using a free space type S-parameter measurement method. Measurements were performed using the following devices.

Vector network analyzer (Keysight PNA N5222B 10 MHz-26.5 GHz, manufactured by Virginia Diodes Inc., WR12 55-95 GHz)

High frequency network analyzer (E8362C manufactured by Agilent Technologies Inc.)

Millimeter waves were applied to each sample from a transmission antenna, and the intensity of the millimeter waves reflected by the sample and incident on a reception antenna was measured to calculate a return attenuation (dB). The maximum value of the return attenuation in the range of 60 GHz to 90 GHz, and the frequency achieving this maximum value were listed on Tables 1 and 2.

TABLE 1

| | | | | Ex. 1 | Ex. 2 | Ex. 3 |
|---|---|---|---|---|---|---|
| Structure | Designed layer | Complex permittivity | Real part | 2.85 | 2.85 | 2.85 |
| | | | Imaginary part | 0 | 0 | 0 |
| | Resistance layer | Material | | — | — | PEDOT/PSS |
| | | Sheet resistance [Ω/sq] | | — | — | 430 |
| | Electro-magnetic wave suppression layer | Material | | Magnetic material | Acrylic adhesive/ Ba2TiO4 nano particles | Acrylic adhesive/ Ba2TiO4 nano particles |
| | | Complex magnetic permeability/complex permittivity/ | | 0.8-0.3j | 10.8-0.74j | 10.8-0.74j |
| | | Thickness [μm] | | $2.5\times10^3$ | 1990 | 260 |
| | Reflective layer | Material | | — | Al/PET | Al/PET |
| Evaluation | Maximum value of return attenuation [dB] | | | 30 | 20 | 40 |
| | Frequency [GHz] | | | 76.0 | 79.0 | 79.0 |

TABLE 2

| | | | | Comp. Ex. 1 | Comp. Ex. 2 | Comp. Ex. 3 |
|---|---|---|---|---|---|---|
| Structure | | Permittivity | | — | — | — |
| | Designed layer | Complex permittivity | Real part | — | — | — |
| | | | Imaginary part | — | — | — |
| | Resistance layer | Material | | — | — | — |
| | | Sheet resistance [Ω/sq] | | — | — | — |
| | Electro-magnetic wave suppression layer | Material | | — | Magnetic material | Urethane |
| | | Complex magnetic permeability/complex permittivity/ | | — | 0.8-0.3j | — |
| | | Thickness [μm] | | — | $2.5 \times 10^3$ | $83 \times 10^3$ (Top-bottom distance) |
| | Reflective layer | Material | | Al/PET | — | Al/PET- |
| Evaluation | Maximum value of return attenuation [dB] | | | 0 | 30 | 50 |
| | Frequency [GHz] | | | — | 76.0 | 76.0 |

Example 4

A reflective type electromagnetic wave suppressor was prepared as in Example 3 except that a surface protective layer having a thickness of 10 μm was provided by coating so as to cover the design layer. Composition of the surface protective layer was as shown below.

Acrylic resin: ATC-354 (manufactured by DIC Corporation) 100 parts by mass

Antibacterial agent A: Apacider AW (manufactured by Sangi Co., Ltd., antibacterial material in which metallic silver (silver component) was supported on calcium phosphate) 2 parts by mass

Example 5

A reflective type electromagnetic wave suppressor was prepared as in Example 3 except that a surface protective layer having a thickness of 10 μm was provided by coating so as to cover the design layer. Composition of the surface protective layer was as shown below.

Urethane resin: URV283 gloss varnish (manufactured by Toyo Ink Co., Ltd.) 100 parts by mass Curing agent: UR150B varnish (manufactured by Toyo Ink Co., Ltd.) 10 parts by mass Antibacterial agent B: RASAP QB-2500G (manufactured by RASA Industries, Ltd., inorganic-organic hybrid antibacterial agent in which an organic antibacterial agent was intercalated with a sparingly soluble phosphate) 2 parts by mass Table 3 shows evaluations for Examples 3 to 5. In the table, the "initial maximum value of return attenuation" and the "initial frequency" are values measured similarly to the above. These values indicated in "after contamination" are values measured after immersing each sample in ammonium water (10% concentration) for 24 hours and contaminating the design layer (Example 3) or the surface protective layer (Examples 4 and 5) according to JIS K6902:2007.

TABLE 3

| | | | | Ex. 3 | Ex. 4 | Ex. 5 |
|---|---|---|---|---|---|---|
| Structure | Surface protective layer | | | — | Containing antibacterial agent A | Containing antibacterial agent B |
| | Designed layer | Complex permittivity | Real part | 2.85 | 2.85 | 2.85 |
| | | | Imaginary part | 0 | 0 | 0 |
| | Resistance layer | Material | | PEDOT/PSS | PEDOT/PSS | PEDOT/PSS |
| | | Sheet resistance [Ω/sq] | | 430 | 430 | 430 |
| | Electro-magnetic wave suppression layer | Material | | Acrylic adhesive/ $Ba_2TiO_4$ nano particles | Acrylic adhesive/ $Ba_2TiO_4$ nano particles | Acrylic adhesive/ $Ba_2TiO_4$ nano particles |
| | | Complex magnetic permeability/complex permittivity/ | | 10.8-0.74j | 10.8-0.74j | 10.8-0.74j |
| | | Thickness [μm] | | 260 | 260 | 260 |
| | Reflective layer | Material | | Al/PET | Al/PET | Al/PET |
| Evaluation | Initial | Maximum value of return attenuation [dB] | | 40 | 84 | 46 |
| | | Frequency [GHz] | | 79.0 | 79.0 | 79.0 |
| | After contamination | Maximum value of return attenuation [dB] | | 26 | 84 | 46 |
| | | Frequency [GHz] | | 72.7 | 79.0 | 79.0 |

Reference Signs List: 1 . . . Design layer; 2 . . . Resistance layer; 3 . . . Electromagnetic wave suppression layer (electromagnetic wave suppressor); 4 . . . Reflective layer; 4*a* . . . Surface; 8 . . . Surface protective layer; 10, 20, 30 . . . Designed electromagnetic wave suppressor.

What is claimed is:

1. A designed electromagnetic wave suppressor, comprising:

(a) a design layer having 0 imaginary part of complex permeability and 5 or less of a real part of complex permeability;

(b) a resistance layer having a sheet resistance having a sheet resistance of 270 Ω/sq to 500 Ω/sq;

(c) an electromagnetic wave suppression layer comprising acrylic adhesive and $Ba_2TiO_4$ nanoparticles; and (d) an Al/PET reflective layer;

wherein the designed electromagnetic wave suppressor has an electromagnetic wave return attenuation of 10 dB or more in a frequency range of 60 GHz to 90 GHz.

2. The designed electromagnetic wave suppressor of claim 1, further comprising a surface protective layer on an outermost surface, the surface protective layer containing at least one of an antiviral agent and an antibacterial agent.

3. The designed electromagnetic wave suppressor of claim 2, wherein the surface protective layer has a thickness of 10 μm to 50 μm.

4. The designed electromagnetic wave suppressor of claim 2, wherein a real part of a complex permittivity of the surface protective layer is 7 or less.

5. The designed electromagnetic wave suppressor of claim 2, wherein the antiviral agent contains a silver component.

6. The designed electromagnetic wave suppressor of claim 2, wherein the antibacterial agent is at least one selected from a group consisting of silver-based antibacterial agents, inorganic antibacterial agents, and organic antibacterial agents.

7. A building material comprising the designed electromagnetic wave suppressor of claim 1.

8. An electromagnetic wave suppression chamber, comprising:

a room in which at least part of inner walls is covered with the building material of claim 7; and a transmitter disposed in the room.

9. A system comprising the electromagnetic wave suppression chamber of claim 8; and a wireless communication device disposed in the electromagnetic wave suppression chamber.

10. The designed electromagnetic wave suppressor of claim 1, wherein a maximum value of return attenuation of the suppressor in the frequency range of 60 GHz to 90 GHz is 10 db or more.

11. The designed electromagnetic wave suppressor of claim 1, wherein a maximum value of return attenuation of the suppressor in the frequency range of 60 GHz to 90 GHz is 20 db or more.

12. The designed electromagnetic wave suppressor of claim 1, wherein a maximum value of return attenuation of the suppressor in the frequency range of 60 GHz to 90 GHz is 26 db or more.

13. The designed electromagnetic wave suppressor of claim 1, wherein a maximum value of return attenuation of the suppressor in the frequency range of 60 GHz to 90 GHz is 30 db or more.

* * * * *